United States Patent
Miller et al.

(10) Patent No.: US 8,184,684 B2
(45) Date of Patent: May 22, 2012

(54) AUTOMATIC GAIN CONTROL STRESS MEASUREMENT FOR DIGITAL CARRIERS

(76) Inventors: Walter Miller, Greenwood, IN (US); Daniel K. Chappell, Greenwood, IN (US); Pingnan Shi, Greenwood, IN (US)

( * ) Notice: Subject to any disclaimer, the term of this patent is extended or adjusted under 35 U.S.C. 154(b) by 776 days.

(21) Appl. No.: 12/241,823

(22) Filed: Sep. 30, 2008

(65) Prior Publication Data
US 2009/0086804 A1 Apr. 2, 2009

Related U.S. Application Data

(60) Provisional application No. 60/976,669, filed on Oct. 1, 2007.

(51) Int. Cl.
*H04B 3/46* (2006.01)

(52) U.S. Cl. ........ 375/224; 375/228; 375/316; 375/345; 73/627

(58) Field of Classification Search .................. 375/316, 375/345, 228
See application file for complete search history.

(56) References Cited

U.S. PATENT DOCUMENTS

| | | | | |
|---|---|---|---|---|
| 5,511,425 | A * | 4/1996 | Kleinert et al. | 73/627 |
| 6,680,914 | B1 * | 1/2004 | Jung et al. | 370/252 |
| 7,085,333 | B2 * | 8/2006 | Jeffers et al. | 375/345 |
| 7,792,183 | B2 * | 9/2010 | Massey et al. | 375/227 |
| 2004/0174942 | A1 * | 9/2004 | Ashida | 375/345 |
| 2005/0053127 | A1 * | 3/2005 | Shiue et al. | 375/232 |
| 2005/0129148 | A1 * | 6/2005 | Isaksen et al. | 375/326 |
| 2005/0144648 | A1 * | 6/2005 | Gotwals et al. | 725/111 |
| 2005/0180528 | A1 * | 8/2005 | Manku | 375/316 |
| 2005/0260963 | A1 * | 11/2005 | Ponce De Leon et al. | 455/226.3 |
| 2006/0222116 | A1 * | 10/2006 | Hughes et al. | 375/345 |
| 2006/0229026 | A1 * | 10/2006 | Lynch | 455/69 |
| 2008/0039012 | A1 * | 2/2008 | McKay et al. | 455/11.1 |
| 2008/0089402 | A1 * | 4/2008 | Massey et al. | 375/227 |
| 2008/0151763 | A1 * | 6/2008 | Lee et al. | 370/241 |
| 2010/0150207 | A1 * | 6/2010 | Lomp | 375/130 |

* cited by examiner

*Primary Examiner* — Chieh M Fan
*Assistant Examiner* — Santiago Garcia
(74) *Attorney, Agent, or Firm* — Matthew A. Pequignot; Pequignot + Myers LLC

(57) ABSTRACT

The testing equipment of the present invention calculates a single "AGC stress" value, which provides an indication of the stability of the level of a digital carrier based on the change in gain required to stabilize the power of an incoming cable signal over time. Ideally the AGC stress value is rated on a scale, e.g. 1 to 10 or 0 to 5, and is fed into the DQI measurement system as a new data model.

14 Claims, 3 Drawing Sheets

AUTOMATIC GAIN CONTROL STRESS MEASUREMENT FOR DIGITAL CARRIERS

CROSS-REFERENCE TO RELATED APPLICATIONS

The present invention claims priority from U.S. Patent Application No. 60/976,669 filed Oct. 1, 2007, entitled "Automatic Gain Control (AGC) Stress Measurement For Digital Carriers", by Miller et al., which is incorporated herein by reference for all purposes.

TECHNICAL FIELD

The present invention relates to the measurement of a parameter that provides an indication of malfunctioning amplifiers and/or modulators in a cable television (CATV) network, and in particular to an apparatus and method for measuring gain fluctuations required by an automatic gain control system in a QAM demodulator for maintaining the power level of a digital channel constant.

BACKGROUND OF THE INVENTION

With reference to FIG. 1, a cable television (CATV) network 1 in accordance with the present invention includes a head end 2, which transmits RF cable television and other data and information signals downstream over cables 3 via hubs 4 and nodes 6 to customer receiving equipment 7 in customer buildings 5. Amplifiers 8 are positioned throughout the network 1 to amplify the downstream signals to ensure the transmitted signals reach the customer receiving equipment 7 with a desired quality of service (QoS). Each of the amplifiers 8 has a built in automatic gain control (AGC) circuit 11 to adjust the level of their gain (up or down).

Initially, each amplifier 8 is set with a nominal setting that is appropriate for the respective amplifier 8 in the network 1. Normally, a field technician would go to each amplifier 8 during the first installation and balance out the amplifiers 8 so the signal levels leaving each amplifier 8 are correct. If the AGC circuit 11 in an amplifier 8 is faulty, that amplifier 8 will cause level fluctuation on all the channels coming out thereof. Moreover, if a modulator in the headend 2 has a problem with its output level, that particular channel produced by the modulator will have level fluctuation. That level fluctuation will cause the receiving equipment 7, which receives the digital channel, to exercise their own AGC algorithms to hold the power level of the digital channel signal constant for demodulation. Some receiver equipment 7 is better able to hold the power level of the digital channel signals steady, thereby compensating for power fluctuations in the digital channel signals and making any problems with the digital channel signal difficult to detect. However, customer receiver equipment 7 tends to be on the inexpensive side, and thus often fails or has much worse bit errors than test equipment, whereby the test equipment would fail to detect problems the customer receiver equipment is experiencing.

An object of the present invention is to overcome the shortcomings of the prior art by providing a method and test equipment for informing a technician how "hard" the AGC loop in the test equipment 21 is working, e.g. required gain fluctuations, to hold the power level of the incoming signal steady for demodulation, thereby indicating that the level of the digital channel carrier is not stable. A hard working AGC loop indicates that either an amplifier 8 in the CATV network 1 has a faulty AGC circuit 11 or a modulator in the headend 2 is malfunctioning. A technician can use the test equipment 21, in accordance with the present invention, to check the AGC stress at the proper points in the network 1 to determine whether the problem is related to a faulty AGC circuit 11 or a malfunctioning modulator in the headend 2.

SUMMARY OF THE INVENTION

Accordingly, the present invention relates to a method for determining the stability of a modulated carrier signal comprising:

a) receiving said modulated carrier signal in a device, including input circuitry with an automatic gain control system therein; and b) measuring a degree to which said automatic gain control system is compensating for instability in said modulated carrier signal; and c) providing a visual indication of the degree to which said automatic gain control system is compensating for instability in said modulated carrier signal.

Another aspect of the present invention relates to a testing device comprising:

an input port for receiving an input RF cable television signal channel;

a demodulator chip for demodulating the input RF cable television signal channel into a bit stream of data, the demodulator chip including an automatic gain control system comprised of a programmable gain amplifier and an automatic gain control loop for controlling the programmable gain amplifier;

a controller for determining a stress index value corresponding to a degree to which said automatic gain control system is compensating for instability in said cable television signal channel; and a user interface for providing an indication of the stress index.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
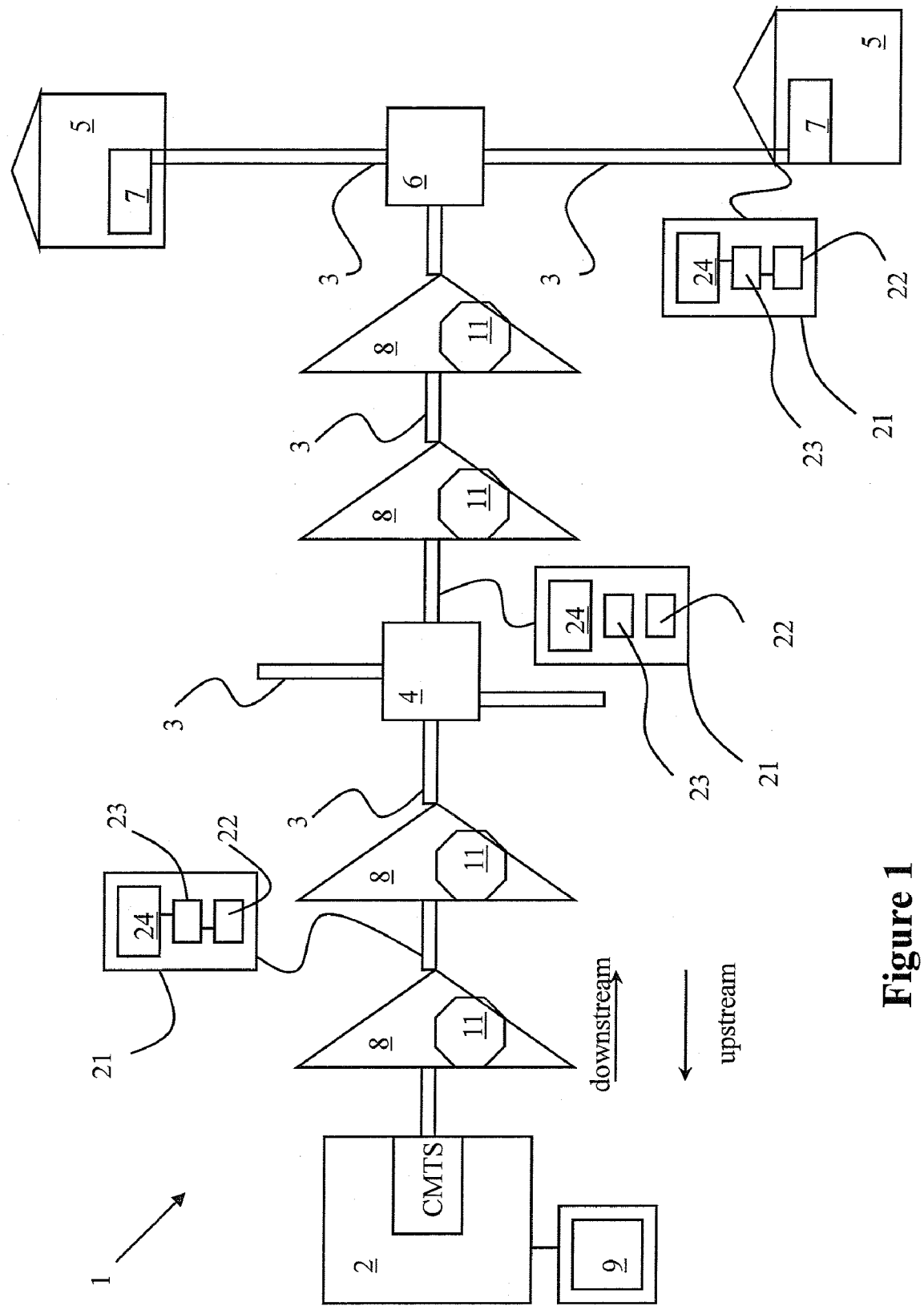
FIG. 1 is a schematic illustration of a cable network.
Figure 2:
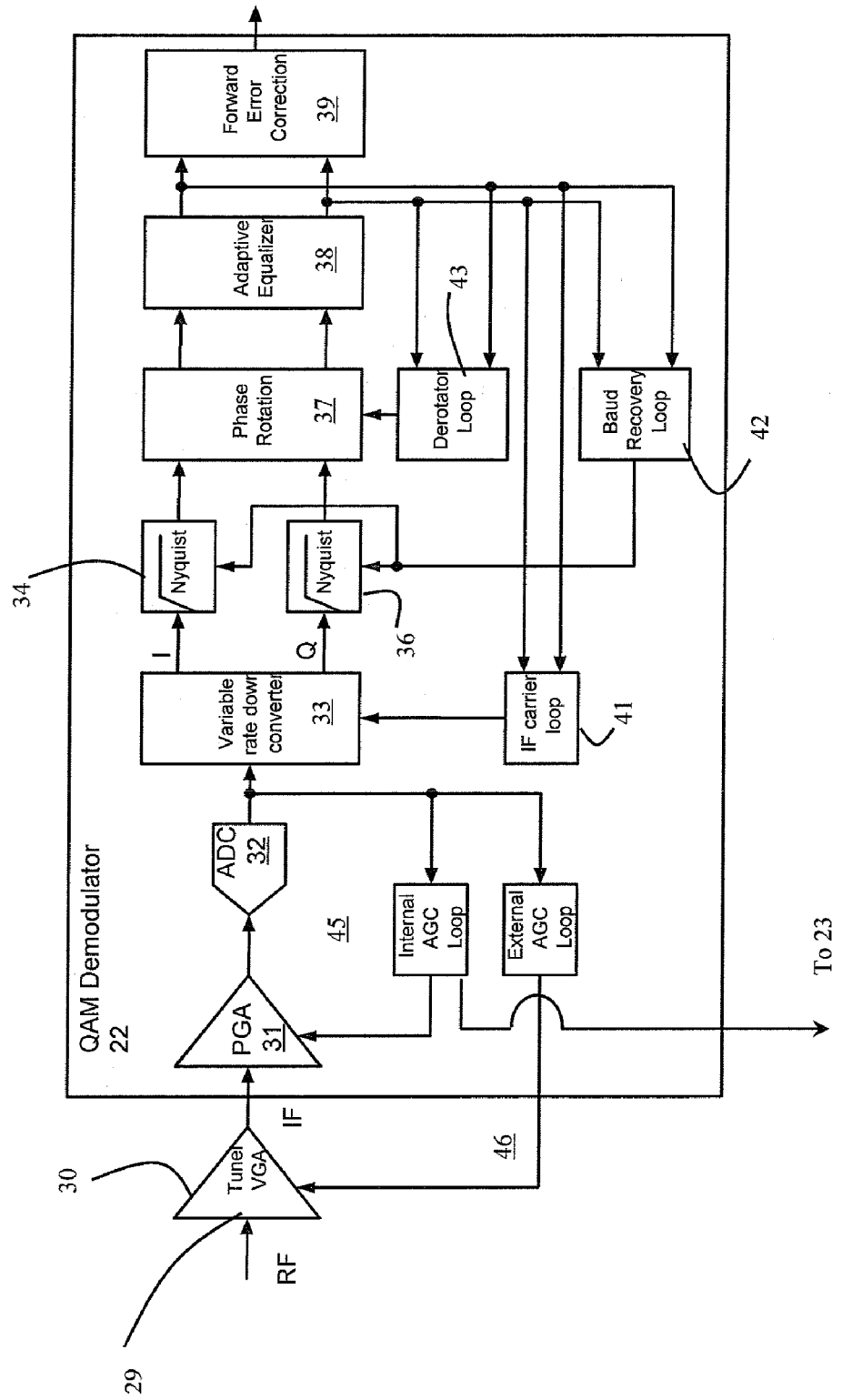
FIG. 2 is a schematic illustration of a QAM demodulator chip in accordance with the present invention.

In accordance with the present invention, a testing device 21 includes a QAM demodulator chip 22 with an AGC system associated therewith, a control system 23, and a user interface 24, e.g. in the form of a display screen with indicator lights and/or audio output. FIG. 2 illustrates the major functional blocks in a typical QAM demodulator chip 22. The RF cable signal is received at an input port 29 connected to a variable gain amplifier 30 in a tuner, which are typically separate from the demodulator chip 22. An intermediate frequency (IF) signal is first amplified by a Programmable Gain Amplifier (PGA) 31 before being digitalized by the Analog to Digital Converter (ADC) 32. The digitized signal is then down-converted to baseband I and Q signals by down converter 33. After being filtered by the Nyquist filters 34 and 36, the I and Q signals pass through a Phase Rotation device 37 and an Adaptive Equalizer 38 to get the optimal QAM symbols. The symbols then are converted to a bit stream. The bit stream is provided to an error corrector 39 in which Forward Error Correction is applied to correct any bit errors before the bit stream is repackaged as an MPEG Transport Stream. Feedback from the equalizer 38 is provided to the down converter 33 via an IF carrier loop 41, to the Nyquist filters 34 and 36 via the baud recovery loop 42, and to the phase rotator 37 via the de-rotator loop 43, as is well understood by a person skilled in the art.

The Internal AGC loop 45 measures the signal power of the digital signal, and then provides feedback from the ADC 32 in the form of a control signal to the PGA 31 to adjust the gain of the PGA 31, i.e. to keep the power of the digital signal at the output of the ADC 32 at a constant level. The External AGC Loop 46 works in the same way as the internal AGC loop 45, except that it sends a control signal to the VGA 20 outside of the demodulator chip 22 to control the gain of the VGA 30.

When the testing device 21 is connected to a test point in the CATV network 1, any level fluctuation of the channel under measurement will cause the output of the Internal AGC Loop 45 to fluctuate accordingly, in order to maintain the level constancy. Therefore, by monitoring the fluctuation of the AGC Loop output, the fluctuation of the signal level of the digital channel under measurement can be detected.

The testing device 21 of the present invention utilizes the fluctuation information extracted from the Internal AGC Loop 45 to provide an indication of faulty equipment. For testing purposes, the output of the External AGC Loop 46 needs to stay at a fixed level, which can be achieved by either setting the external AGC Loop 46 to a fixed value, or by ensuring the output of the external AGC loop 46 is constant during the measurement. One way is to monitor the output of the AGC loop 46 to ensure it is constant during the measurement.

The testing device 21 is connected to the cable network 1 at a suitable location, e.g. proximate the customer's building 5 or equipment 7 or proximate amplifiers 8. The QAM demodulator chip 22 has a range of gain, e.g. 10 dB, over which the power level of the incoming signal is controlled. A stress index value, which is obtained from the QAM demodulator chip 22, by a control system 23 of the testing device 21 is a percentage of the AGC range that is being used over a certain sample period, which can easily be converted to a dB value for graphical display. For example, if during one sample period, e.g. 1 to 2 seconds, preferably 1 second, the QAM demodulator chip 22 is using 40% of the AGC range, and in the next sample period the chip 22 is using 50% of the AGC range, the QAM demodulator chip 22 has compensated for the level change by using 10% of its total capacity to correct the level over the given time period.

Another method is to sample the output of the AGC loop 45, e.g. more than 100 samples, per update period, by reading the integrator register of the Internal AGC Loop 45. An update period is typically from 1 to 2 seconds, but preferably 1 second. The minimum (min) and maximum (max) values of the 128 samples from the integrator register are obtained by the control system 23, and the difference in dB (Dif) is calculated by the following formula:

$$\text{Dif} = 20 * \log 10(\text{max}/\text{min})$$

The difference (Dif) measurement can be used by the control system 23 in various ways to indicate AGC stress. The first is to compare the measured Dif value to a threshold value (TH) to determine if the measured Dif value exceeds the threshold value. If the measured Dif value exceeds the threshold value, then the testing device 21 provides a warning indication on the user interface 24 for that update period. The value of the threshold (TH) is dependent on the QAM demodulator chip 22, e.g. for Broadcom's BCM3349 demodulator chip 0.65 dB can be used as the threshold, but between 0.4 to 1.0 dB are typical threshold values.

Another way to utilize the Dif measurement is to assign an integer value on a predetermined scale, which is called AGC Stress Index (ASI), e.g. from 1 to 5 or 0 to 10, as a function of the difference (Dif) over a given time period, e.g. 1 to 2 seconds, preferably 1 second, with the following boundary conditions:

a substantial change will rate a minimum score, e.g. 1 or 0.
ASI=0, if Dif≧a threshold value (TH)
A minimal or no change in AGC fluctuation will obtain a maximum rating, e.g. 5 or 10,
ASI=10, if Dif=0 dB The ASI can either be shown on the user interface 24 or the rating can be combined and averaged with the DQI ratings system described in co-pending United States Patent Application Publication No. 2008/0089402, published Apr. 17, 2008, which is incorporated herein by reference. One of the variables is the kind of QAM demodulator chip used in the measuring device. Utilizing the example above, a single DQI update period with an AGC Max-to-Min delta of 10% would have a lower DQI value, e.g. ASI=9, than a similar period with a 5% Max-to-Min delta, e.g. ASI=9.5.

Figure 3:
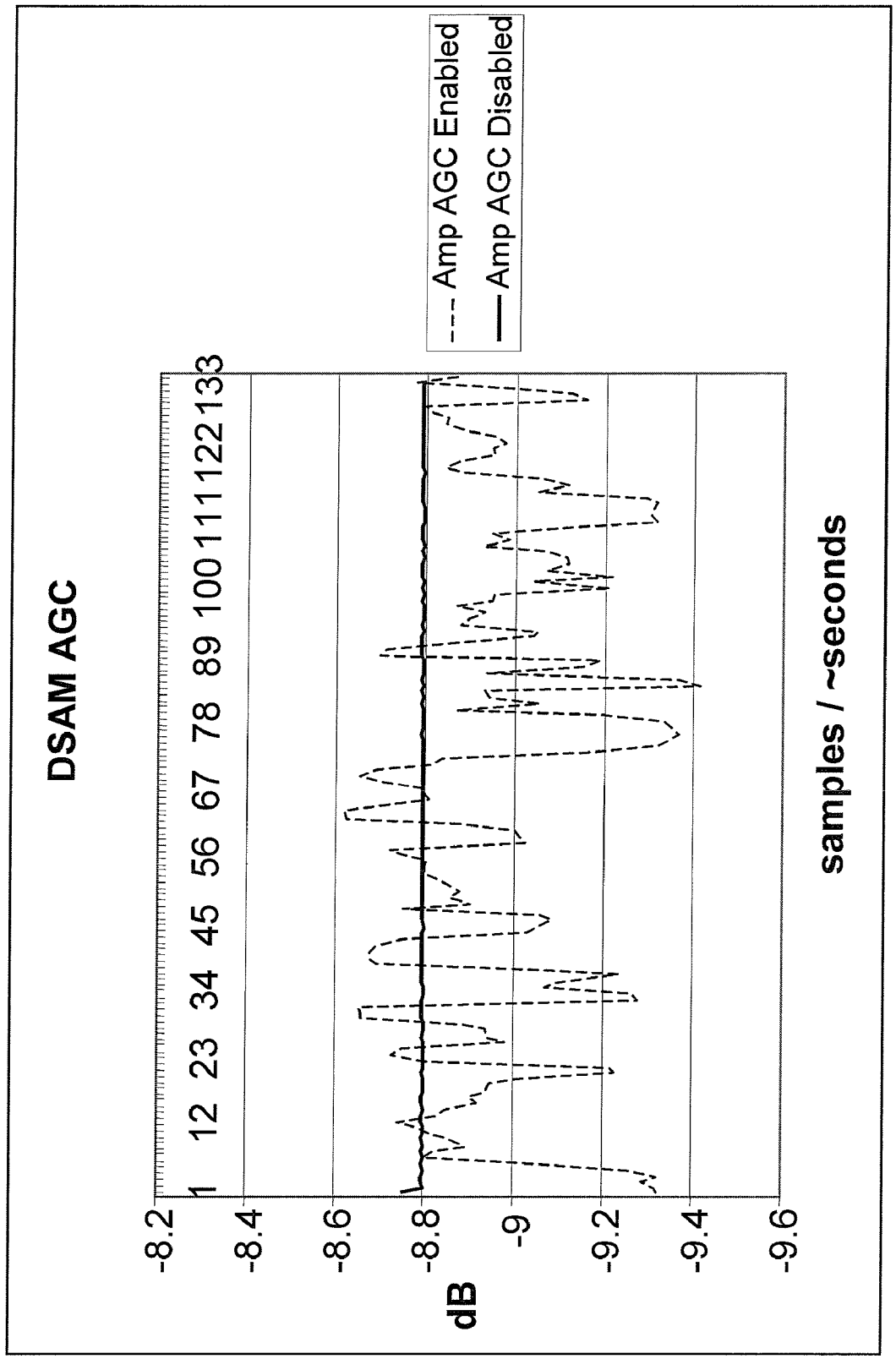
FIG. 3 is a plot of gain fluctuation over time.

FIG. 3 is a graph illustrating two traces of the internal AGC fluctuations from a digital service activation meter (DSAM®), in accordance with the present invention, taken from the output of an amplifier 8, which was determined to have a faulty AGC circuit. The first trace (flat) represents the AGC fluctuations when the faulty amplifier AGC is disabled, whereby the AGC in the test device 21 is working at a constant level, i.e. −8.8 dB, to maintain the incoming cable signal at a constant power level, i.e. the cable signal under test has relatively constant power. The second trace (volatile) represents the AGC fluctuations when the faulty amplifier AGC is enabled, whereby the AGC in the test device is fluctuating from −8.6 dB to −9.4 dB, i.e. a difference of 0.8 dB to maintain the incoming cable signal at a constant power level, i.e. the cable signal under test has a fluctuation power level, due to the faulty amplifier. A delta of 0.8 dB would typically be over the threshold value TH, and would result in a warning indication to the technician that a faulty amplifier exists. While some test equipment currently in the field could detect that there are bit errors in the cable signal under test, the present invention provides the method and means to generate a metric, which would enable the user to know "why" the bit errors exist, e.g. a faulty AGC in the prior amplifier 8. Moreover, even if bit errors are not yet detected, the present invention is able to anticipate that a lower quality customer equipment device 7 might see bit errors.

We claim:

1. A method for determining the stability of a modulated carrier signal comprising:
   a) receiving said modulated carrier signal from an external network in a testing device, including input circuitry with an automatic gain control system therein; and
   b) measuring a degree to which said automatic gain control system is compensating for instability in said modulated carrier signal;
   c) determining a stress index value based on the measured degree;
   d) comparing the stress index value to a threshold value; and
   e) providing a visual indication of at least one of the degree to which said automatic gain control system is compensating for instability in said modulated carrier signal and a visual indication if the stress index value exceeded the threshold value.

2. The method according to claim 1, wherein step b) includes determining gain fluctuations required by the automatic gain control system.

3. The method according to claim 1, wherein step b) includes determining a change in the percentage of available gain from the automatic gain control system was utilized to compensate the modulated carrier signal from one time period to another time period.

4. The method according to claim 1, wherein step b) includes obtaining a minimum and a maximum value from an integrator register of the automatic gain control system for a predetermined number of samples over a predetermined update period.

5. The method according to claim 1, further comprising determining a relative value of the stress index value on a predetermined scale, which ranges from a first value corresponding to relatively no fluctuation to a second value corresponding to a threshold fluctuation value.

6. The method according to claim 4, wherein the update period is between 0.5 and 2 seconds.

7. The method according to claim 4, wherein the predetermined number of samples is greater than 100.

8. A testing device comprising:
   an input port for receiving an input RF cable television signal channel from an external network;
   a demodulator chip for demodulating the input RF cable television signal channel into a bit stream of data, the demodulator chip including an automatic gain control system comprised of a programmable gain amplifier and an automatic gain control loop for controlling the programmable gain amplifier;
   a controller for determining a stress index value corresponding to a degree to which said automatic gain control system is compensating for instability in said cable television signal channel and for comparing the stress index value to a threshold value; and
   a user interface for providing an indication of at least one of the stress index value and an indication if the stress index value exceeds the threshold.

9. The testing device according to claim 8, wherein the controller is capable of determining gain fluctuations in the programmable gain amplifier required to compensate the input RF cable television signal channel over a predetermined time period, whereby the stress index value is based on the gain fluctuations.

10. The testing device according to claim 8, wherein the controller is capable of determining a change in the percentage of available gain from the programmable gain amplifier was utilized to compensate the input RF cable television signal channel from one time period to another time period, whereby the stress index value is based on the change in the percentage of available gain utilized.

11. The testing device according to claim 8, wherein the controller is capable of obtaining the minimum and maximum values from an integrator register of the programmable gain amplifier over a predetermined update period; whereby the stress index value is based on the minimum and maximum values.

12. The testing device according to claim 8, wherein the controller is capable determining a relative value of the stress index value on a predetermined scale, which ranges from a first value corresponding to relatively no fluctuation to a second value corresponding to a threshold fluctuation value.

13. The testing device according to claim 11, wherein the update period is between 0.5 and 2 seconds.

14. The testing device according to claim 11, wherein the predetermined number of samples is greater than 100.

* * * * *